United States Patent
Lee et al.

(10) Patent No.: US 8,188,492 B2
(45) Date of Patent: May 29, 2012

(54) LIGHT EMITTING DEVICE HAVING PLURAL LIGHT EMITTING DIODES AND AT LEAST ONE PHOSPHOR FOR EMITTING DIFFERENT WAVELENGTHS OF LIGHT

(75) Inventors: Sang Min Lee, Siheung-si (KR); Hyuck Jung Choi, Seoul (KR); Mi Hae Kim, Suwon-si (KR)

(73) Assignee: Seoul Semiconductor Co., Ltd., Seoul (KR)

( * ) Notice: Subject to any disclaimer, the term of this patent is extended or adjusted under 35 U.S.C. 154(b) by 285 days.

(21) Appl. No.: 12/439,052

(22) PCT Filed: Aug. 24, 2007

(86) PCT No.: PCT/KR2007/004066
§ 371 (c)(1),
(2), (4) Date: Feb. 26, 2009

(87) PCT Pub. No.: WO2008/026851
PCT Pub. Date: Mar. 6, 2008

(65) Prior Publication Data
US 2009/0315053 A1    Dec. 24, 2009

(30) Foreign Application Priority Data
Aug. 29, 2006  (KR) .................. 10-2006-0082501

(51) Int. Cl.
*H01L 33/50*    (2010.01)
(52) U.S. Cl. ..... 257/89; 257/98; 257/100; 257/E33.061; 257/E33.074
(58) Field of Classification Search ............ 257/E33.061
See application file for complete search history.

(56) References Cited

U.S. PATENT DOCUMENTS
2,110,162 A    3/1938    Leverenz
(Continued)

FOREIGN PATENT DOCUMENTS
AT    410266    3/2003
(Continued)

OTHER PUBLICATIONS

Feldmann C., "Inorganic Luminescent Materials: 100 Years of Research and Application", Adv. Funct. Matter, 2003, pp. 511-516.

(Continued)

*Primary Examiner* — Stephen W Smoot
(74) *Attorney, Agent, or Firm* — H.C. Park & Associates, PLC

(57) ABSTRACT

The present invention provides a light emitting device, comprising a first light emitting diode for emitting light in an ultraviolet wavelength region; at least one phosphor arranged around the first light emitting diode and excited by the light emitted from the first light emitting diode to emit light having a peak wavelength longer than the wavelength of the light emitted from the first light emitting diode; and at least one second light emitting diode for emitting light having a wavelength different from the peak wavelength of the light emitted from the phosphor. According to the present invention, there is provided a white light emitting device, wherein using a light emitting diode for emitting light different in wavelength from light that is ex-cititively emitted from the phosphor, an excitation light source, i.e., light in the ultraviolet region for exciting the phosphor is effectively used, thereby improving energy conversion efficiency and improving reliability.

16 Claims, 2 Drawing Sheets

U.S. PATENT DOCUMENTS

| | | |
|---|---|---|
| 2,402,760 A | 6/1946 | Leverenz |
| 2,570,136 A | 10/1951 | Lyon |
| 2,617,773 A | 11/1952 | Nagy et al. |
| 2,719,128 A | 9/1955 | Kressin |
| 2,780,600 A | 2/1957 | Wollentin |
| 3,143,510 A | 8/1964 | Wanmaker et al. |
| 3,598,752 A | 8/1971 | Sisneros |
| 3,644,212 A | 2/1972 | McAllister et al. |
| 3,893,939 A | 7/1975 | De Kalb et al. |
| 3,905,911 A | 9/1975 | Kelsey, Jr. et al. |
| 4,215,289 A | 7/1980 | De Hair et al. |
| 4,770,950 A | 9/1988 | Ohnishi |
| 4,972,086 A | 11/1990 | Bryan et al. |
| 5,032,316 A | 7/1991 | Takahashi et al. |
| 5,177,669 A | 1/1993 | Juskey |
| 5,433,295 A | 7/1995 | Murphy |
| 5,472,636 A | 12/1995 | Forster et al. |
| 5,518,808 A | 5/1996 | Bruno et al. |
| 5,770,110 A | 6/1998 | Schrell et al. |
| 5,770,111 A | 6/1998 | Moriyama et al. |
| 5,853,614 A | 12/1998 | Hao et al. |
| 5,952,681 A | 9/1999 | Chen |
| 5,958,100 A | 9/1999 | Farnworth |
| 5,965,192 A | 10/1999 | Potter |
| 5,998,925 A | 12/1999 | Shimizu et al. |
| 6,045,722 A | 4/2000 | Leblans et al. |
| 6,066,861 A | 5/2000 | Hohn et al. |
| 6,084,250 A | 7/2000 | Justel et al. |
| 6,274,924 B1 | 8/2001 | Carey et al. |
| 6,373,184 B1 | 4/2002 | Suh et al. |
| 6,472,765 B1 | 10/2002 | Sano et al. |
| 6,482,664 B1 | 11/2002 | Lee et al. |
| 6,517,218 B2 | 2/2003 | Hochstein |
| 6,565,771 B1 | 5/2003 | Ono et al. |
| 6,670,751 B2 | 12/2003 | Song et al. |
| 6,686,691 B1 | 2/2004 | Mueller et al. |
| 6,747,293 B2 | 6/2004 | Nitta et al. |
| 6,842,664 B2 | 1/2005 | Harada et al. |
| 6,924,514 B2 | 8/2005 | Suenaga |
| 6,982,045 B2 | 1/2006 | Menkara et al. |
| 6,982,048 B1 | 1/2006 | Atwater et al. |
| 6,987,353 B2 | 1/2006 | Menkara et al. |
| 7,019,335 B2 | 3/2006 | Suenaga |
| 7,029,602 B2 | 4/2006 | Oshio |
| 7,045,078 B2 | 5/2006 | Choi |
| 7,138,770 B2 | 11/2006 | Uang et al. |
| 7,189,340 B2 | 3/2007 | Shimomura et al. |
| 7,206,507 B2 | 4/2007 | Lee et al. |
| 7,229,571 B2 | 6/2007 | Ezuhara et al. |
| 7,244,965 B2 | 7/2007 | Andrews et al. |
| 7,321,161 B2 | 1/2008 | Teixeira et al. |
| 7,332,746 B1 | 2/2008 | Takahashi et al. |
| 7,468,147 B2 | 12/2008 | Shida et al. |
| 7,554,129 B2 | 6/2009 | Roth et al. |
| 7,608,200 B2 | 10/2009 | Seto et al. |
| 7,679,101 B2 | 3/2010 | Ota et al. |
| 7,679,281 B2 | 3/2010 | Kim et al. |
| 7,737,463 B2 | 6/2010 | Lee et al. |
| 7,855,395 B2 | 12/2010 | Lee et al. |
| 2001/0030866 A1 | 10/2001 | Hochstein |
| 2002/0015013 A1 | 2/2002 | Ragle |
| 2003/0038295 A1 | 2/2003 | Koda |
| 2003/0168636 A1 | 9/2003 | Dobson et al. |
| 2004/0041222 A1 | 3/2004 | Loh |
| 2004/0051111 A1 | 3/2004 | Ota et al. |
| 2004/0104391 A1 | 6/2004 | Maeda et al. |
| 2004/0135504 A1 | 7/2004 | Tamaki et al. |
| 2004/0136891 A1 | 7/2004 | Kijima et al. |
| 2004/0206970 A1 | 10/2004 | Martin |
| 2004/0227145 A1 | 11/2004 | Abe et al. |
| 2004/0227149 A1 | 11/2004 | Ibbetson et al. |
| 2004/0251809 A1 | 12/2004 | Shimomura et al. |
| 2005/0001225 A1 | 1/2005 | Yoshimura et al. |
| 2005/0001537 A1 | 1/2005 | West et al. |
| 2005/0029927 A1 | 2/2005 | Setlur et al. |
| 2005/0045901 A1 | 3/2005 | Wall, Jr. |
| 2005/0117334 A1 | 6/2005 | Lee et al. |
| 2005/0139846 A1 | 6/2005 | Park et al. |
| 2005/0141048 A1 | 6/2005 | Mizutani |
| 2005/0239227 A1 | 10/2005 | Aanegola et al. |
| 2005/0264161 A1 | 12/2005 | Oaku et al. |
| 2005/0269587 A1 | 12/2005 | Loh et al. |
| 2005/0274930 A1 | 12/2005 | Roth et al. |
| 2005/0274972 A1 | 12/2005 | Roth et al. |
| 2006/0012299 A1 | 1/2006 | Suehiro |
| 2006/0076883 A1 | 4/2006 | Himaki et al. |
| 2006/0102915 A1* | 5/2006 | Kim ............................. 257/98 |
| 2006/0103012 A1 | 5/2006 | Chin |
| 2006/0138435 A1 | 6/2006 | Tarsa et al. |
| 2006/0158090 A1 | 7/2006 | Wang et al. |
| 2006/0208270 A1* | 9/2006 | Chandran et al. ............. 257/100 |
| 2006/0261309 A1 | 11/2006 | Li et al. |
| 2006/0261350 A1 | 11/2006 | Kawazoe et al. |
| 2006/0267042 A1 | 11/2006 | Izuno et al. |
| 2007/0029526 A1 | 2/2007 | Cheng et al. |
| 2007/0247051 A1 | 10/2007 | Kuze et al. |
| 2007/0284563 A1 | 12/2007 | Lee et al. |
| 2008/0036364 A1 | 2/2008 | Li et al. |
| 2008/0067472 A1 | 3/2008 | Roth et al. |
| 2008/0067920 A1 | 3/2008 | Roth et al. |
| 2008/0224163 A1 | 9/2008 | Roth et al. |
| 2009/0050847 A1 | 2/2009 | Xu et al. |
| 2009/0050849 A1 | 2/2009 | Lee et al. |
| 2009/0134413 A1 | 5/2009 | Roth et al. |
| 2009/0152496 A1 | 6/2009 | Roth et al. |
| 2009/0262515 A1 | 10/2009 | Lee et al. |
| 2009/0303694 A1 | 12/2009 | Roth et al. |
| 2010/0002454 A1 | 1/2010 | Lee et al. |
| 2010/0165645 A1 | 7/2010 | Lee et al. |
| 2010/0207132 A1 | 8/2010 | Lee et al. |

FOREIGN PATENT DOCUMENTS

| | | |
|---|---|---|
| CN | 1218084 | 6/1999 |
| CN | 1289454 | 3/2001 |
| CN | 1317537 | 10/2001 |
| CN | 1344777 | 4/2002 |
| CN | 1380704 | 11/2002 |
| CN | 1434521 | 8/2003 |
| CN | 2624578 | 7/2004 |
| CN | 1581503 | 2/2005 |
| CN | 2690724 | 4/2005 |
| CN | 1702809 | 11/2005 |
| CN | 1706043 | 12/2005 |
| CN | 1707819 | 12/2005 |
| DE | 10214119 | 10/2003 |
| DE | 10233050 | 2/2004 |
| DE | 10259946 | 7/2004 |
| EP | 0094132 | 11/1983 |
| EP | 0382295 | 8/1993 |
| EP | 0862794 | 9/1998 |
| EP | 0896994 | 2/1999 |
| EP | 1246266 | 10/2002 |
| EP | 1249873 | 10/2002 |
| EP | 1249874 | 10/2002 |
| EP | 1439584 | 7/2004 |
| EP | 1484802 | 12/2004 |
| EP | 1605030 | 12/2005 |
| EP | 2031038 | 3/2009 |
| GB | 1336053 | 11/1973 |
| GB | 2016034 | 9/1979 |
| JP | 31-1118 | 2/1956 |
| JP | 33-8177 | 9/1958 |
| JP | 38-6082 | 5/1963 |
| JP | 39-8803 | 5/1964 |
| JP | 47-6258 | 4/1972 |
| JP | 49-38994 | 10/1974 |
| JP | 55-135190 | 10/1980 |
| JP | 57-109886 | 7/1982 |
| JP | 61-258892 | 11/1986 |
| JP | 62-197487 | 9/1987 |
| JP | 5-78659 | 3/1993 |
| JP | 7111343 | 4/1995 |
| JP | 8-335720 | 12/1996 |
| JP | 9-40946 | 2/1997 |
| JP | 9-153644 | 6/1997 |
| JP | 9-279140 | 10/1997 |
| JP | 11-121809 | 4/1999 |

| | | |
|---|---|---|
| JP | 11112036 | 4/1999 |
| JP | 2000-150967 | 5/2000 |
| JP | 2001-185763 | 7/2001 |
| JP | 2001-223305 | 8/2001 |
| JP | 2001-308393 | 11/2001 |
| JP | 2001-524163 | 11/2001 |
| JP | 2002-50795 | 2/2002 |
| JP | 2002-057376 | 2/2002 |
| JP | 2002-094122 | 3/2002 |
| JP | 2002-97466 | 4/2002 |
| JP | 2002-170999 | 6/2002 |
| JP | 2002-173677 | 6/2002 |
| JP | 2002-252373 | 9/2002 |
| JP | 2002-314139 | 10/2002 |
| JP | 2002-335019 | 11/2002 |
| JP | 2002-359403 | 12/2002 |
| JP | 2002-368277 | 12/2002 |
| JP | 2003-064358 | 3/2003 |
| JP | 2003-152229 | 5/2003 |
| JP | 2003-183649 | 7/2003 |
| JP | 2003-224306 | 8/2003 |
| JP | 2003-321675 | 11/2003 |
| JP | 2004-006582 | 1/2004 |
| JP | 2004-010786 | 1/2004 |
| JP | 2004-505470 | 2/2004 |
| JP | 2004-071726 | 3/2004 |
| JP | 2004-71807 | 3/2004 |
| JP | 2004-127988 | 4/2004 |
| JP | 2004-134699 | 4/2004 |
| JP | 2004-192833 | 7/2004 |
| JP | 2004-221598 | 8/2004 |
| JP | 2004-235261 | 8/2004 |
| JP | 2001-115157 | 12/2004 |
| JP | 2005-167177 | 6/2005 |
| JP | 2006-073656 | 3/2006 |
| JP | 2006-128456 | 5/2006 |
| JP | 2006-173433 | 6/2006 |
| JP | 2007-186674 | 7/2007 |
| JP | 2009-007545 | 1/2009 |
| KR | 10-232395 | 12/1999 |
| KR | 10-2001-0032450 | 4/2001 |
| KR | 10-2001-0050839 | 6/2001 |
| KR | 10-2001-0101910 | 11/2001 |
| KR | 10-2002-0000835 | 1/2002 |
| KR | 10-2002-0053975 | 7/2002 |
| KR | 10-0392363 | 7/2002 |
| KR | 10-2002-0079513 | 10/2002 |
| KR | 10-2003-0063211 | 7/2003 |
| KR | 10-2003-0082395 | 10/2003 |
| KR | 10-0426034 | 7/2004 |
| KR | 10-2004-0070870 | 8/2004 |
| KR | 10-2004-0088418 | 10/2004 |
| KR | 10-2005-0008426 | 1/2005 |
| KR | 10-2005-0049729 | 5/2005 |
| KR | 10-2005-0070349 | 7/2005 |
| KR | 10-2005-0098462 | 10/2005 |
| KR | 10-2005-0106945 | 11/2005 |
| KR | 10-2005-0117164 | 12/2005 |
| KR | 10-2006-0034056 | 4/2006 |
| KR | 10-0626272 | 9/2006 |
| KR | 10-2006-0134728 | 12/2006 |
| KR | 10-2007-0016900 | 2/2007 |
| KR | 10-2007-0050833 | 5/2007 |
| KR | 10-2008-0046789 | 5/2008 |
| RU | 2134000 | 7/1999 |
| TW | I328885 | 3/1999 |
| WO | 96-32457 | 10/1996 |
| WO | 98-05078 | 2/1998 |
| WO | 98-12757 | 3/1998 |
| WO | 98-39805 | 9/1998 |
| WO | 98-42798 | 10/1998 |
| WO | 00-19546 | 4/2000 |
| WO | 00/55914 | 9/2000 |
| WO | 01-41215 | 6/2001 |
| WO | 02-054502 | 7/2002 |
| WO | 02-054503 | 7/2002 |
| WO | 02-089219 | 11/2002 |
| WO | 03-021691 | 3/2003 |
| WO | 2004-085570 | 10/2004 |
| WO | 2004/102685 | 11/2004 |
| WO | 2004-111156 | 12/2004 |
| WO | 2005-068584 | 7/2005 |
| WO | 2005-112137 | 11/2005 |
| WO | 2005109532 | 11/2005 |
| WO | 2006/006544 | 1/2006 |
| WO | 2006-043682 | 4/2006 |
| WO | 2006-068359 | 6/2006 |
| WO | 2006-081803 | 8/2006 |
| WO | 2006/109659 | 10/2006 |
| WO | WO 2006/126819 A1 * | 11/2006 |
| WO | 2007-035026 | 3/2007 |
| WO | 2007-055538 | 5/2007 |
| WO | 2007-069869 | 6/2007 |
| WO | 2007-114614 | 11/2007 |
| WO | 2009028818 | 3/2009 |

OTHER PUBLICATIONS

G. Blasse, B.C. Grabmeier, "Luminescent Materials", Springer, 1994, 87-90.
B. Cordero, V. Gómez, A. E. Platero-Prats, M. Revés, J. Echeverria, E. Cremades, F. Barragán, and S. Alvarez, "Covalent radii revisted", Dalton Trans., (2008), pp. 2832-2838.
R.J. Angel et al., "Structure and twinning of single-crystal MgSiO3 garnet synthisized at 17 GPa and 1800 °C", American Mineralogist, 74 (1989) pp. 509-512.
G.L. Miessler, D.A. Tarr, "Inorganic Chemistry", 3rd ed., Pearson / Prentice Hall, pp. 117-118.
P.A. Cox, "Transition Metal Oxides", Oxford University Press, 1995, p. 105.
Garcia Solé, L.E. Bausá, D. Jaque, "An Introduction to the Optical Spectroscopy of Inorganic Solids", Wiley, 2005, pp. 163-164.
G. Blasse, B.C. Grabmeier, "Luminescent Materials", Springer, 1994, p. 25.
S. Shionoya, W.M. Yen, "Phospher Handbook" CRC press, 1999, ch. 3.3, pp. 183-184.
Garcia Solé, L.E. Bausá, D. Jaque, "An Introduction to the Optical Spectroscopy of Inorganic Solids", Wiley, 2005, pp. 132-133.
S. Shionoya, W.M. Yen, "Phosphor Handbook" CRC press, 1999, ch. 3.3, pp. 179-182.
G. Blasse, A. Bril, "Characteristic Luminescence", Philips Technical Review, 31 (1970) 304, p. 306.
G. Blasse, B.C. Grabmeier, "Luminescent Materials", Springer, 1994, pp. 40-47.
"Developments in Luminescence and Display Materials Over the Last 100 Years as Reflected in Electrochemical Society Publications", pp. 69-78, 2002.
Non-Final Office Action of U.S. Appl. No. 11/568,769 issued on Feb. 16, 2011.
Non-Final Office Action of U.S. Appl. No. 13/004,554 issued on Mar. 15, 2011.
Notice of Allowance of U.S. Appl. No. 11/024,722 issued on Mar. 10, 2011.
Final Office Action of U.S. Appl. No. 12/196,923 issued on Mar. 4, 2011.
Notice of Allowance of U.S. Appl. No. 11/948,845 issued on Mar. 23, 2011.
Non-Final Office Action of U.S. Appl. No. 12/098,263 issued on Mar. 30, 2011.
Indian Office Action of Indian Application No. 2468/KOLNP/2007 issued on Jan. 28, 2011, corresponding to U.S. Appl. No. 12/098,263.
Non-Final Office Action of U.S. Appl. No. 12/854,001 issued on Apr. 6, 2011.
Non-Final Office Action of U.S. Appl. No. 12/440,001 issued on Apr. 27, 2011.
Chinese Office Action of Chinese Patent Application No. 200880105091.8 issued on Apr. 1, 2011.
Chinese Office Action of Chinese Patent Application No. 201010198537.5 issued on Mar. 18, 2011.
Chinese Office Action of Chinese Patent Application No. 201010185274.4 issued on Mar. 2, 2011.
Austrian Office Action for AT Application No. 9514/2005 issued on Jun. 1, 2011.

Austrian Office Action for AT Application No. 1545/2010-1 issued on May 31, 2011.
Final Office Action of U.S. Appl. No. 12/731,811 issued on Jul. 29, 2011.
Notice of Allowance of U.S. Appl. No. 11/948,813 issued on Aug. 22, 2011.
Final Office Action of U.S. Appl. No. 12/854,001 issued on Oct. 11, 2011.
Notice of Allowance of U.S. Appl. No. 12/098,263 issued on Oct. 11, 2011.
International Search Report for PCT/KR2010/003302 issued on Jan. 3, 2011, corresponding to U.S. Appl. No. 12/767,253.
Final Office Action dated Dec. 8, 2010 in U.S. Appl. No. 11/948,813.
Final Office Action dated Dec. 23, 2010 in U.S. Appl. No. 11/569,060.
Non Final Office Action dated Dec. 29, 2010 in U.S. Appl. No. 12/731,811.
Final Office Action dated Dec. 7, 2010 in U.S. Appl. No. 11/948,845.
Non Final Office Action dated Nov. 26, 2010 in U.S. Appl. No. 12/440,001.
Non Final Office Action dated Nov. 24, 2010 in U.S. Appl. No. 12/093,441.
Final Office Action dated Nov. 30, 2010 in U.S. Appl. No. 11/024,722.
Non Final Office Action dated Nov. 30, 2010 in U.S. Appl. No. 12/196,923.
Notice of Allowance dated Aug. 18, 2010 in U.S. Appl. No. 12/098,263.
Final Office Action dated May 11, 2010 in U.S. Appl. No. 12/098,263.
Non Final Office Action dated Mar. 17, 2010 in U.S. Appl. No. 11/024,722.
Non Final Office Action dated Aug. 17, 2010 in U.S. Appl. No. 11/948,845.
EP Search Report dated Sep. 1, 2010 in EP Appl No. 08015119 correpsonding to U.S. Appl. No. 12/440,001.
EP Search Report dated Oct. 6, 2010 in EP Appl No. 07745750.5—corresponding to U.S. Appl. No. 12/295,438.
Non Final Office Action dated Jun. 16, 2010 in U.S. Appl No. 12/097,741.
Final Office Action dated Nov 12, 2010 in U.S. Appl. No. 12/097,741.
Non-Final Office Action dated Aug. 10, 2010 in U.S. Appl. No. 11/024,722.
Final Office Action dated Jun. 21, 2010 in U.S. Appl. No. 11/569,060.
Non-Final Office Action dated Apr. 30, 2010 in U.S. Appl. No. 11/568,769.
Final Office Action dated Sep. 9, 2010 in U.S. Appl. No. 11/568,769.
CN Office Action dated Feb. 5, 2010 in CN Appl. No. 2005100023042.
European Search Report of Oct. 26, 2010 in EP 10 17 7817, corresponding to U.S. Appl. No. 11/024,722.
Non-Final Office Action dated Aug. 18, 2010 in U.S. Appl. No. 11/948,813.
Non-Final Office Action dated Aug. 10, 2010 in U.S. Appl. No. 12/731,811.
IP Australia Office Action dated Jul. 2, 2010 for AU Patent Appl. No. 2005-319965, corresponding to U.S. Appl. No. 12/098,263.
TW Office Action of Sep. 10, 2010 in TW Patent Appl. No. 098123458.
European Search Report of Sep. 23, 2010 in European Patent Appl. No. 10 16 4970.
Non-final office action dated May 29, 2009 issued in U.S. Appl. No. 11/024,722, filed Dec. 30, 2004.
Notice of Allowance dated May 4, 2009 issued in U.S. Appl. No. 11/024,702.
Non-final office action dated Nov. 29, 2007 issued in U.S. Appl. No. 11/024,702, filed Dec. 30, 2004.
Non-final office action dated Aug. 12, 2009 issued in U.S. Appl. No. 11/569,060, filed Jun. 22, 2007.
Non-final office action dated Jan. 13, 2010 issued in U.S. Appl. No. 11/569,060, filed Jun. 22, 2007.
Non-final office action dated Nov. 17, 2009 issued in U.S. Appl. No. 12/097,741, filed Oct. 9, 2008.
Bogner et al., DE 102 33 050 A1, Feb. 5, 2004, Machine Traslation.
Final office action dated Feb. 7, 2007 issued in U.S. Appl. No. 11/024,702, filed Dec. 30, 2004.
Non-final office action dated Jun. 22, 2006 issued in U.S. Appl. No. 11/024,702, filed Dec. 30, 2004.
Non-final office action dated Nov. 29, 2006 issued in U.S. Appl. No. 11/024,722, filed Dec. 30, 2004.
Final office action dated Oct. 28, 2009 issued in U.S. Appl. No. 11/024,722, filed Dec. 30, 2004.
Non-final office action dated May 23, 2007 issued in U.S. Appl. No. 11/024,722, filed Dec. 30, 2004.
Non-final office action dated Nov. 14, 2008 issued in U.S. Appl. No. 11/024,722, filed Dec. 30, 2004.
Non-final office action dated Nov. 2, 2009 issued in U.S. Appl. No. 12/098,263.
Ralchenko, Yu., Kramida, A.E., Reader, J. and NIST ASD Team (2008). NIST Atomic Spectra Database (version 3.1.5), [Online]. Available: http://physics.nist.gov/asd3 [Feb. 27, 2009]. National Institute of Standards and Technology, Gaithersburg, MD.
N. S. Akhmetov, "Inorganic Chemistry", Moscow "Vysshaya Shkola", 1975; (partial translation; translated pp. 332-3, 372-3, 384-5, 427, 432, 436, 445, 471, 476, 486, 491, 496-7, 501, 546-9).
Markovsky L, Ya. et al., Phosphors (Moscow-Leningrad, Khimiya Publishers, 1966, p. 7 (partial translation).
Search Report dated Apr. 11, 2006 for EP Application No. EP04106880.0.
Search Report dated Nov. 5, 2008 for EP Application No. EP06812549.1.
Search Report dated Aug. 21, 2007 for EP Application No. EP04106882.6.
International Search Report for PCT/KR2010/003285 issued on Jan. 24, 2011, corresponding to U.S. Appl. No. 12/773,514.
International Search Report dated Jul. 12, 2007 for PCT Application No. PCT/KR2007/001587.
International Search Report dated Mar. 21, 2007 for PCT Application No. PCT/KR2006/005500.
International Search Report dated Feb. 20, 2007 for PCT Application No. PCT/KR2006/004716.
International Search Report dated Oct. 24, 2005 for PCT Application No. PCT/KR2005/002332.
International Search Report dated Oct. 13, 2005 for PCT Application No. PCT/KR2005/002333.
International Search Report dated Aug. 12, 2005 for PCT Application No. PCT/KR2005/001288.
International Search Report dated Aug. 12, 2005 for PCT Application No. PCT/KR2005/001287.
International Search Report dated Feb. 27, 2009 for PCT Application No. PCT/KR2008/004734.
International Search Report dated Feb. 11, 2009 for PCT Application No. PCT/KR2008/004733.
Joung Kyu Park, et al., "Silicate Phosphors for White LEDs Identified Through Combinatorial Chemistry", Electrochemical and Solid-State Letters, vol. 10(2), pp. J15-J18, (2007), XP-00251106706-11-12).
Joung Kyu Park, et al., "Luminescence Characteristics of Yellow Emitting Ba3SiO5:EU2+ Phosphor", Journal of Materials Science 40 (2005), pp. 2069-2071, XP-002511068.
Search Report dated Feb. 2, 2009 for EP Application No. EP08014684.
S.D. Jee, et al., "Photoluminescence properties of Eu2+ -activated Sr3SiO5 Phosphors," J. Mater Sci. 41 (2006), pp. 3139-3141.
G. Blasse, et al., "Fluorescence of Europium2+-activated silicates," Philips Res. Repts 23 (1968), pp. 189-199.
G. Roth, et al. "Advanced Silicate Phosphors for improved white LED", Global Phosphor Summit Seoul/Korea, Mar. 5-7, 2007.
H.G. Kang, et al., "Embodiment and Luminescence Properties of Sr3SiO5:Eu(yellow-orange phosphor) by co-doping lanthanide", Solid State Phenomena, vol. 124-126 (2007) pp. 511-514.
T.L. Barry, "Fluorescence of Eu2+ Activated Phases in Binary Alkaline Earth Orthosilicate Systems", J. Electrochem Soc., Nov. 1968, pp. 1181-1184.
Notice of Allowance dated Dec. 1, 2008 issued in U.S. Appl. No. 11/024,702.

Chinese Office Action corresponding to Patent App No. 2005800150173 dated Dec. 28, 2007.
Final OA dated Oct. 22, 2007 issued in U.S. Appl. No. 11/024,722.
Office Action dated Dec. 28, 2007 corresponding to China App No. 200580016844.4.
X. W. Sun et al., "Pulsed Laser Deposition of Silicate Phosphor Thin Films", Appl. Phys. A 69, 1999, 5 pp.
W.L. Wanmaker et al. "Luminescence of Phosphors Based on the Host Lattice ABGe2O6 (A, B=Ca, Sr, Ba)" Journal of Solid State Chemistry 3, (1971), pp. 194-196.
Non-Final OA mailed May 23, 2007 for U.S. Appl. No. 11/024,722 entitled "Luminescent Material".
Ageeth A. Bol et al., "Luminescence of ZnS:Cu2+", Journal of Luminescence, No. 99, 2002, pp. 325-334.
J.F. Suyver et al., "Luminescence of nanocrystalline ZnSe:Cu", Applied Physics Letters, vol. 79, No. 25, Dec. 17, 2001, pp. 4222-4224.
Ping Yang et al., "Photoluminescence of Cu+-doped and Cu2+-doped ZnS nanocrystallites", Journal of Physics and Chemistry of Solids, No. 63, 2002, pp. 638-643.
S. Shionoya et al., (Eds.), "Principal phosphor materials and their optical properties" in Phosphor Handbook, CRC Press, 1999, pp. 231-255.
A. Scacco et al., "Optical Spectra of Cu2+ Ions in LiF Crystals", Radiation Effects and Defects in Solids, vol. 134, 1995, pp. 333-336.
Lujcan Dubicki et al., "The First d-d Fluorescence of a Six-Coordinate Copper (II) Ion", J. Am. Chem. Soc. 1989, No. 111, pp. 3452, 3454.
A.B.P. Lever, "Inorganic Electronic Spectroscopy", 2nd ed., Elsevier, 1984, pp. 355 and 557-559.
A.G. Shenstone, "The Third Spectrum of Copper (Cu III)", Journal of Research of the National Bureau of Standards—A. Physics and Chemistry, vol. 79A, No. 3, May-Jun. 1975, pp. 497-521.
S. Shinoya et al. (Eds.), "Principal phosphor materials and their optical properties" in Phosphor Handbook, CRC Press, 1999, p. 826.
First Office Action of the PRC to Chinese Patent App No. 20051002304.2 dated Feb. 15, 2008.
Yang, "Up- Conversion Fluorescence in Er3 + Yb3 + Co- Doped Oxy—Fluoride Compound Materials Based on GeO2", Natural Science Journal of Xiangtan University, vol. 23, No. 2, 2001, pp. 37-41.
Bernhardt, Investigations of the Orange Luminescence of PbMo04 Crystals, Phys. Stat. Sol (a), 91, 643, 1985, pp. 643-647.
Butler, "Fluorescent Lamp Phosphors", The Pennsylvania State University Press, 1980, pp. 175-176.
Butler, "Fluorescent Lamp Phosphors", The Pennsylvania State University Press, 1980, pp. 181-182.
Wanmaker, Luminescence of Copper-Activated Orthophosphates of the Type ABPO (A=Ca, Sr, or Ba and B=Li, Na or K), Journal of the Electrochemical Society, pp. 109-113.
Butler, "Fluorescent Lamp Phosphors", The Pennsylvania State University Press, 1980, pp. 281-284.
"Phosphors for Mercury Lamps" https:/www.lamptech.co.uk/Docuemnts/M14%20Phosphors.htm 2003 (2 pages).
Blasse, "Radiationless Processes in Luminescent Materials", Radiationless Processes, 1980, pp. 287-289, 293.
Shinonoya, "Phosphor Handbook", edited under the auspice of Phosphor Research Society, CRC Press, 1999, pp. 204-205.
Shinonoya, "Phosphor Handbook", edited under the auspice of Phosphor Research Society, CRC Press, 1999, p. 238-239, 241.
Wanmaker, "Luminescence of Copper-Activated Calcium and Strontium Orthophosphates", Journal of the Electromagnetic Society, pp. 1027-1031, 1959.
van Gool, "Philips Res. Rept. Suppl." 3, 1, 1961, pp. 1-9, 30-51, 84-85.
Declaration Under Rule 37 CFR 1.132 of Ulrich Kynast dated Sep. 6, 2008.
G. Blasse, "Characteristic Luminescence", Philips Technical Review, vol. 31, 1970, pp. 304-332.
Non-Final Office Action of U.S. Appl. No. 12/196,028 dated on Jun. 2, 2009.
European Search Report of EP Application No. 05 76 5982 dated Aug. 24, 2009.
Non-Final Office Action of U.S. Appl. No. 11/575,128 dated on Oct. 16, 2008.
Non-Final Office Action of U.S. Appl. No. 11/575,128 dated on Jul. 24, 2009.
Final Office Action of U.S. Appl. No. 11/575,128 dated on Dec. 29, 2009.
Non-Final Office Action of U.S. Appl. No. 11/575,128 dated on Jun. 4, 2010.
Notice of Allowance of U.S. Appl. No. 11/575,128 dated on Oct 7, 2010.
Ex Parte Quayle Action of U.S. Appl. No. 12/196,028 dated on Dec. 30, 2009.
Notice of Allowance of U.S. Appl. No. 12/196,028 dated on Mar. 31, 2010.
Declaration under CFR 1.132 of U.S. Appl. No. 11/024,722 dated Aug. 24, 2007.

\* cited by examiner

LIGHT EMITTING DEVICE HAVING PLURAL LIGHT EMITTING DIODES AND AT LEAST ONE PHOSPHOR FOR EMITTING DIFFERENT WAVELENGTHS OF LIGHT

CROSS REFERENCE TO RELATED APPLICATIONS

This application is the National Stage of International Application No. PCT/KR2007/004066, filed Aug. 24, 2007, and claims priority from and the benefit of Korean Patent Application No. 10-2006-0082501, filed on Aug. 29, 2006, which are both hereby incorporated by reference for all purposes as if fully set forth herein.

BACKGROUND OF THE INVENTION

1. Field of the Invention

The present invention relates to a light emitting device, and more particularly, to a light emitting device in which an energy conversion efficiency can be improved by using an ultraviolet light emitting diode as an excitation source of a phosphor.

2. Discussion of the Background

A light emitting diode (LED) refers to a device for emitting light through recombination of minority carriers (electrons or holes) as a compound semiconductor having p-n junction structure. Since the light emitting diode has characteristics of low power consumption, long lifespan, installability in a narrow space, and strong resistance against vibration, the light emitting diode has been increasingly used as various illumination devices as well as parts of various information processing and communication applications and has been manufactured as various light emitting devices which are suitable to various applications. In recent years, white light emitting diodes in addition to single color light emitting devices, such as red, blue or green light emitting devices, have been placed on the market. As the white light emitting devices are applied to products for automobiles and illumination, it is expected that their demands will be rapidly increased.

In a representative method of implementing a white light emitting device, a yellow phosphor is arranged over a blue light emitting diode, so that blue light emitted from the blue light emitting diode and yellow light emitted from the phosphor which is excited by a portion of the blue light are color-mixed to implement white color. Although such a method of implementing white light provides a simple configuration and an excellent mass-producibility, there is a problem in that the shortages of green and red spectra may reduce color rendering.

In another representative method of implementing a white light emitting device, phosphors, which are excited by ultraviolet ray to emit blue, green and red lights, respectively, are arranged over a light emitting diode for emitting ultraviolet ray.

Since such a method uses ultraviolet ray, which is a higher excitation light source than blue light, to emit light having wavelengths from blue to red regions, there is an advantage in that the color rendering is higher. However, various phosphors, such as blue, green and red phosphors, are used, thereby increasing manufacturing costs.

Specifically, the red phosphor which is generally commercialized is sulfide based phosphor. In this case, there is a problem in that the light emitting device easily reacts with water vapor and carbon dioxide in the atmosphere during its operation and therefore the chemical characteristics of the phosphor is distorted. Since the byproduct of such a reaction, $H_2S$ gas, corrodes metal such as electrodes within the light emitting device, there is a problem in that the reliability of the light emitting diode may be reduced.

Further, there is another problem in that the red phosphor has a lower conversion efficiency for the light emitted under the excitation by the excitation energy than blue and green phosphors.

SUMMARY OF THE INVENTION

The present invention is conceived to solve the aforementioned problem. An object of the present invention is to provide a white light emitting device in which energy conversion efficiency can be improved by effectively using ultraviolet light as an excitation source of phosphors.

Another object of the present invention is to provide a white light emitting device in which a light emitting diode for emitting light different in wavelength from light excitatively emitted from a phosphor can be used to improve reliability against vapor and carbon dioxide to which the light emitting device may be easily exposed.

According to the present invention for achieving the objects, there is provided a light emitting device, comprising a first light emitting diode for emitting light in an ultraviolet wavelength region; at least one phosphor arranged around the first light emitting diode and excited by the light emitted from the first light emitting diode to emit light having a peak wavelength longer than the wavelength of the light emitted from the first light emitting diode; and at least one second light emitting diode for emitting light having a wavelength different from the peak wavelength of the light emitted from the phosphor.

The phosphor may be at least any one of silicate based phosphor, germanate based phosphor and germanate-silicate based phosphor, and contains copper, and the phosphor may further contain lead.

The phosphor may include at least any one of a first phosphor having its peak wavelength positioned in a range of 410 nm to 500 nm and a second phosphor having its peak wavelength position in a range of 500 nm to 590 nm.

The phosphor may include a silicate based phosphor represented by Chemical Formula 1:

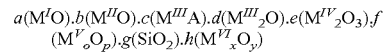

where $M^I$ is at least one element selected from the group containing Cu and Pb; $M^{II}$ is at least one element selected from the group consisting of Be, Mg, Ca, Sr, Ba, Zn, Cd and Mn; $M^{III}$ is at least one element selected from the group consisting of Li, Na, K, Rb, Cs, Au and Ag; $M^{IV}$ is at least one element selected from the group consisting of B, Al, Ga and In; $M^V$ is at least one element selected from the group consisting of Ge, V, Nb, Ta, W, Mo, Ti, Zr and Hf, $M^{VI}$ is at least one element selected from the group consisting of Bi, Sn, Sb, Sc, Y, La, Ce, Pr, Nd, Pm, Sm, Eu, Gd, Tb, Dy, Ho, Er, Tm, Yb and Lu; A is at least one element selected from the group consisting of F, Cl, Br and I; a, b, c, d, e, f, g, h, o, p, x and y are set in ranges of $0<a\leq2$, $0<b\leq8$, $0\leq c\leq4$, $0\leq d\leq2$, $0\leq e\leq2$, $0\leq f\leq2$, $0<g\leq10$, $0<h\leq5$, $1\leq o\leq2$, $1\leq p\leq5$, $1\leq x\leq2$, and $1\leq y\leq5$.

The phosphor may include a germanate and/or germanate-silicate based phosphor represented by Chemical Formula 2:

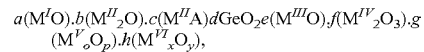

where $M^I$ is at least one element selected from the group containing Cu and Pb; $M^{II}$ is at least one element selected from the group consisting of Li, Na, K, Rb, Cs, Au and Ag; $M^{III}$ is at least one element selected from the group consisting of Be, Mg, Ca, Sr, Ba, Zn, Cd and Mn; $M^{IV}$ is at least one element selected from the group consisting of Sc, Y, B, Al, Ga, In and La; $M^V$ is one or more elements selected from the group consisting of Si, Ti, Zr, Mn, V, Nd, Ta, W and Mo; $M^{VI}$ is at least one element selected from the group consisting of Bi, Sn, Pr, Sm, Eu, Gd, Dy and Tb; A is at least one element selected from the group consisting of F, Cl, Br and I; a, b, c, d, e, f, g, h, o, p, x and y are set in ranges of $0<a\leq2$, $0\leq b\leq2$, $0\leq c\leq10$, $0<d\leq10$, $0\leq e\leq14$, $0\leq f\leq14$, $0\leq g\leq10$, $0\leq h\leq2$, $1\leq o\leq2$, $1\leq p\leq5$, $1\leq x\leq2$, and $1\leq y\leq5$.

The second light emitting diode may include a light emitting diode for emitting light having a wavelength longer than the peak wavelength of the light emitted from the phosphor.

The second light emitting diode may include a light emitting diode for emitting light in a wavelength range of 590 nm to 720 nm.

The second light emitting diode may further include a light emitting diode for emitting light in a wavelength range of 420 nm to 480 nm which is shorter than the peak wavelength of the light emitted from the phosphor.

According to the present invention, a white light emitting device can be provided in which energy conversion efficiency can be improved by effectively using an ultraviolet light emitting diode as an excitation source of a phosphor.

Further, a light emitting diode for emitting light different in wavelength from light excitatively emitted from a phosphor can be used to improve reliability against vapor and carbon dioxide to which the light emitting device may be easily exposed.

DETAILED DESCRIPTION OF THE ILLUSTRATED EMBODIMENTS

Figure 1:
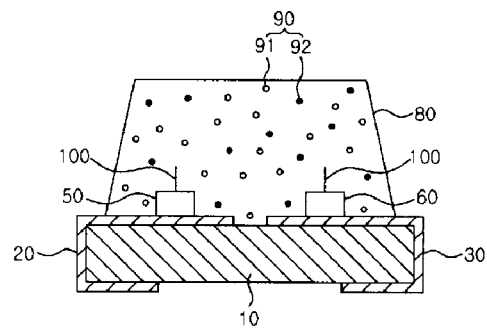
FIG. 1 is a sectional view showing a first embodiment of a light emitting device according to the present invention.

Hereinafter, a light emitting device according to the present invention will be described in detail with reference to the accompanying drawings.

However, the present invention is not limited to a preferred embodiment set forth herein but can be implemented in various forms. In addition, the embodiments are merely provided to allow the present invention to be completely described herein and to fully convey the scope of the invention to those skilled in the art. Throughout the drawings, like reference numerals are used to designate like elements.

A light emitting device of the present invention comprises a first light emitting diode for emitting light in an ultraviolet wavelength region; at least one phosphor arranged around the first light emitting diode and excited by the light emitted from the first light emitting diode to emit light having a peak wavelength longer than the wavelength of the light emitted from the first light emitting diode; and at least one second light emitting diode for emitting light having a wavelength different from the peak wavelength of the light emitted from the phosphor, thereby implementing white light emission.

That is, the light emitting device can be configured in the combination of a first light emitting diode for emitting ultraviolet ray in a wavelength range of 250 nm to 410 nm, a first phosphor for emitting blue light in a peak wavelength range of 410 nm to 500 nm, at least one second phosphor for emitting green and yellow lights in a peak wavelength range of 500 nm to 590 nm, and a second light emitting diode for emitting red light in a wavelength range of 590 nm to 720 nm.

More preferably, the light emitting device can be configured in the combination of a first light emitting diode for emitting light in a wavelength range of 250 nm to 350 nm, a first phosphor for emitting blue light in a peak wavelength range of 440 nm to 480 nm, a second phosphor for emitting green light in a peak wavelength range of 510 nm to 545 nm; and a second light emitting diode for emitting red light in a wavelength range of 620 nm to 660 nm.

The phosphor excited by the light having the ultraviolet wavelength includes at least any one of silicate based phosphor, germanate based phosphor and germanate-silicate based phosphor, which contain copper, and may include a phosphor which further contains lead.

The phosphor may be a silicate based phosphor which is represented by Chemical Formula of chemistry figure 1:

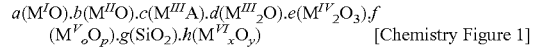
[Chemistry Figure 1]

where $M^I$ is at least one element selected from the group containing Cu and Pb; $M^{II}$ is at least one element selected from the group consisting of Be, Mg, Ca, Sr, Ba, Zn, Cd and Mn; $M^{III}$ is at least one element selected from the group consisting of Li, Na, K, Rb, Cs, Au and Ag; $M^{IV}$ is at least one element selected from the group consisting of B, Al, Ga and In; $M^V$ is at least one element selected from the group consisting of Ge, V, Nb, Ta, W, Mo, Ti, Zr and Hf, $M^{VI}$ is at least one element selected from the group consisting of Bi, Sn, Sb, Sc, Y, La, Ce, Pr, Nd, Pm, Sm, Eu, Gd, Tb, Dy, Ho, Er, Tm, Yb and Lu; A is at least one element selected from the group consisting of F, Cl, Br and I; a, b, c, d, e, f, g, h, o, p, x and y are set in ranges of $0<a\leq2$, $0<b\leq8$, $0\leq c\leq4$, $0\leq d\leq2$, $0\leq e\leq2$, $0\leq f\leq2$, $0<g\leq10$, $0<h\leq5$, $1\leq o\leq2$, $1\leq p\leq5$, $1\leq x\leq2$, and $1\leq y\leq5$.

Figure 2:
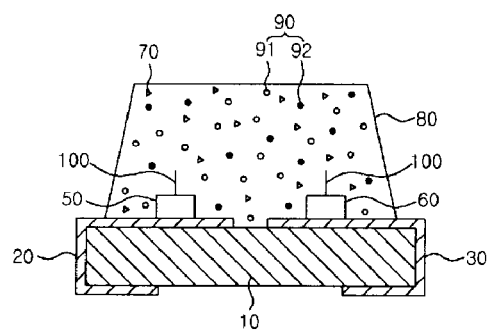
FIG. 2 is a sectional view showing a second embodiment of the light emitting device according to the present invention.

The phosphor may be a germanate and/or germanate-silicate phosphor which is represented by Chemical Formula of chemistry figure 2:

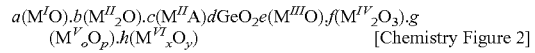
[Chemistry Figure 2]

where $M^I$ is at least one element selected from the group containing Cu and Pb; $M^{II}$ is at least one element selected from the group consisting of Li, Na, K, Rb, Cs, Au and Ag; $M^{III}$ is at least one element selected from the group consisting of Be, Mg, Ca, Sr, Ba, Zn, Cd and Mn; $M^{IV}$ is at least one element selected from the group consisting of Sc, Y, B. Al, Ga, In and La; $M^V$ is one or more elements selected from the group consisting of Si, Ti, Zr, Mn, V, Nd, Ta, W and Mo; $M^{VI}$ is at least one element selected from the group consisting of Bi, Sn, Pr, Sm, Eu, Gd, Dy and Tb; A is at least one element selected from the group consisting of F, Cl, Br and I; a, b, c, d, e, f, g, h, o, p, x and y are set in ranges of $0<a\leq2$, $0\leq b\leq2$, $0\leq c\leq10$, $0<d\leq10$, $0\leq e\leq14$, $0\leq f\leq14$, $0\leq g\leq10$, $0\leq h\leq2$, $1\leq o\leq2$, $1\leq p\leq5$, $1\leq x\leq2$, and $1\leq y\leq5$.

Figure 4:
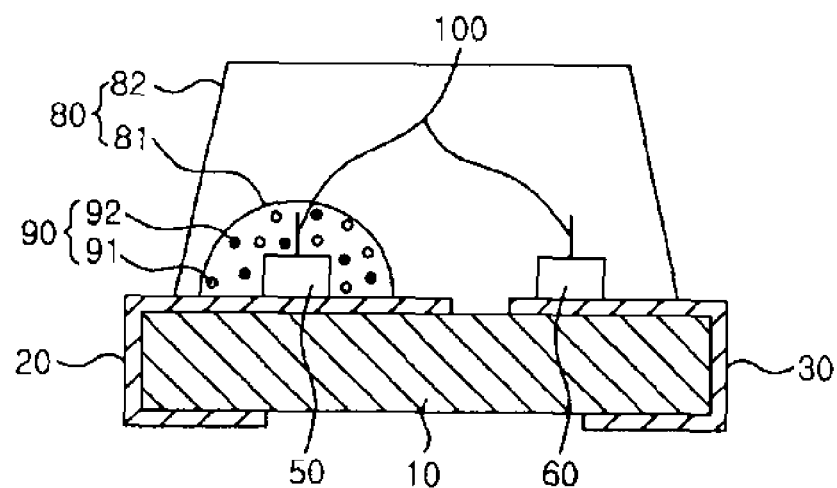
FIG. 4 is a sectional view showing a fourth embodiment of the light emitting device according to the present invention.
Figure 5:
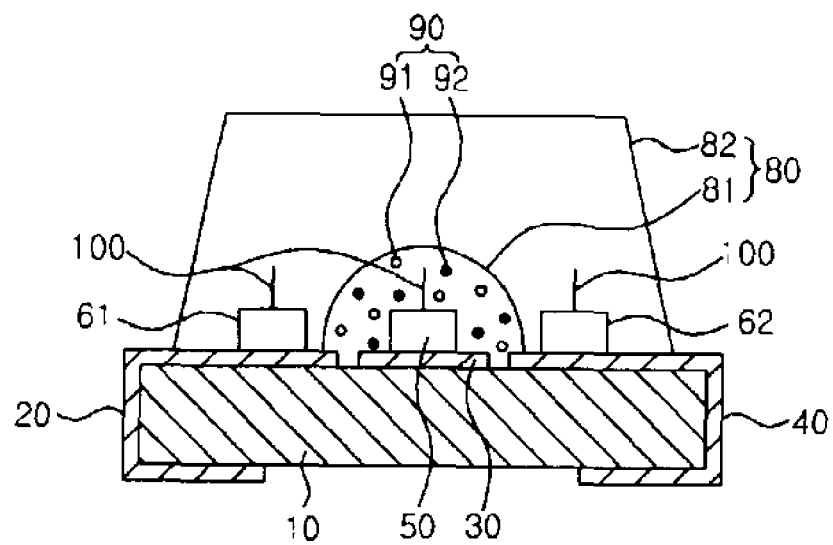
FIG. 5 is a sectional view showing a fifth embodiment of the light emitting device according to the present invention.

Preferably, the silicate based phosphor is represented by Chemical Formula 3:

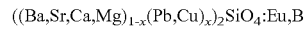

where B is at least one element selected from the group consisting of Bi, Sn, Sb, Sc, Y, La, Ce, Pr, Nd, Pm, Sm, Gd, Tb, Dy, Ho, Er, Tm, Yb, Lu and Mn; x is set in a range of 0 to 1; and Eu and B are set in ranges of 0 to 0.2, respectively.

$$Cu_{0.05}Li_{0.002}Sr_{1.5}Ba_{0.448}SiO_4:Gd,Eu \quad \text{[Chemistry Figure 4]}$$

$$Cu_{0.2}Ba_2Zn_{0.2}Mg_{0.6}Si_2O_7:Eu \quad \text{[Chemistry Figure 5]}$$

$$Cu_{0.02}Sr_{0.38}Ba_{0.90}Ca_{0.6}Si_{0.98}Ge_{0.02}O_4:Eu_{0.1} \quad \text{[Chemistry Figure 6]}$$

The phosphor represented by Chemical Formula 4 emits light having a wavelength of 557 nm, the phosphor represented by Chemical Formula 5 emits light having a wavelength of 467 nm, and the phosphor represented by Chemical Formula 6 emits light having a wavelength of 563 nm. As such, the orthosilicate based phosphor can control its wavelength of emission light depending on its elements and compositions.

As such, the light emitting device according to the present invention comprises a first light emitting diode for emitting light in an ultraviolet wavelength region; at least one phosphor arranged around the first light emitting diode and excited by the light emitted from the first light emitting diode to emit light with a peak wavelength which is longer than the wavelength of the light emitted from the first light emitting diode, i.e., at least one phosphor for emitting blue, green and yellow lights; and at least one second light emitting diode for emitting light having a wavelength different from the peak wavelength of the light emitted from the phosphor, i.e., a red light emitting diode, thereby implementing the white light emission.

Accordingly, as compared with a conventional light emitting device which includes an ultraviolet light emitting diode and phosphors for emitting blue, green and red lights, a red light emitting diode is used on behalf of the red phosphor which has a lower conversion efficiency and is excited by energy of light in an ultraviolet wavelength region as the excitation light source, thereby improving energy conversion efficiency of the white light emitting device.

Further, in comparison with the prior art, the phosphor for emitting a smaller amount of blue and green lights is used to implement white light with the same intensity, thereby reducing its manufacturing costs.

Also, the red light emitting diode is used to solve the problem that the generally commercialized sulfide based red phosphor easily reacts with vapor and carbon dioxide in the atmosphere and the optical characteristics is thus reduced.

Hereinafter, the light emitting device in which the aforementioned phosphors are used according to the present invention will be described with reference to the accompanying drawings.

FIG. 1 is a sectional view showing a first embodiment of the light emitting device according to the present invention.

Referring to the figure, the light emitting device comprises a substrate 10 and first and second electrodes 20 and 30 formed on the substrate 10. A light emitting diode 50 for emitting ultraviolet ray is mounted on the first electrode 20, and first and second phosphors 91 and 92, which are excited by the ultraviolet ray to emit blue and green lights having peak wavelengths longer than the wavelength of the excitation light, are arranged over the first light emitting diode 50.

A second light emitting diode 60 is mounted on the second electrode 30, and emits red light different in wavelength from lights emitted from the first and second phosphors 91 and 92.

The first and second light emitting diodes 50 and 60 are commonly and electrically connected to a third electrode (not shown) through wires 100.

A molding portion 80 for encapsulating the first and second light emitting diodes 50 and 60 is provided on the substrate 10, and the first phosphor 91 for emitting blue light and the second phosphor 92 for emitting green light as described above are included in the molding portion 80.

The substrate 10 may be formed with a predetermined groove around the central region of the substrate 10 through a mechanical processing, and the groove may include a reflection portion (not shown) formed in such a manner that a sidewall surface thereof is inclined at a predetermined slope.

The first and second light emitting diodes 50 and 60 are mounted on a floor surface of the reflection portion, so that the light emitted from the light emitting diode 20 can be maximally reflected to thereby increase its luminous efficiency.

The molding portion 80 may be formed through an injection molding process using a mixture of a predetermined transparent epoxy or silicon resin and the aforementioned phosphors 91 and 92. Alternatively, the molding portion 80 may be formed in such a manner that it is manufactured using a separate mold and then pressurized or heat treated. The molding portion 80 may be formed into various shapes such as a convex lens shape, a flat plate shape, and a shape having a predetermined concavo-convex surface.

At least any one of silicate based phosphor, germanate based phosphor and germanate-silicate based phosphor may be used as the first and second phosphors 91 and 92 which are included within the molding portion 80 for encapsulating the first and second light emitting diodes 50 and 60 on the substrate 10.

It is preferable that the phosphors 91 and 92 are uniformly distributed within the molding portion 80 as shown in the drawing, which causes the red light emitted from the second light emitting diode 60 and the blue and green lights emitted from the phosphors 91 and 92 to be uniformly mixed with each other, thereby implementing more uniform white light. In order to improve the color rendering, a phosphor (not shown) for emitting yellow light may be further included within the molding portion 80.

In such a light emitting device according to the present invention, an excitation light, i.e., light in the ultraviolet region is emitted from the light emitting diode 50 and causes the phosphors 91 and 92 to be excited and emit excitation-emitted lights, and another light which is different from the excitation-emitted lights is emitted from the second light emitting diode 60, so that the excitation light, the excitation-emitted lights and the other light may be color-mixed to implement colors in a required spectrum range.

That is, ultraviolet ray and red light are respectively emitted from the ultraviolet and red light emitting diodes 50 and 60, and the ultraviolet ray allows the first and second phosphors 91 and 92 to emit blue and green lights, respectively, so that the color mixing thereof implements white light emission.

Accordingly, the red light emitting diode is used to improve an energy conversion efficiency of the white light emitting device on behalf of the red phosphor with a lower conversion efficiency in which the red phosphor is excited by a light energy of the excitation light source.

Further, using an ultraviolet light emitting diode with high energy as compared with a blue light emitting diode having been used as the conventional excitation light source, the phosphors for emitting a smaller amount of blue and green lights are used to implement white light with the same intensity, thereby reducing its manufacturing costs.

Also, the red light emitting diode is used to solve the problem that the generally commercialized sulfide based red phosphor easily reacts with vapor and carbon dioxide in the atmosphere to reduce the optical characteristics FIG. 2 is a sectional view showing a second embodiment of the light emitting device according to the present invention.

Referring to this figure, the light emitting device comprises a substrate 10 and first and second electrodes 20 and 30 formed on the substrate 10. A light emitting diode 50 for emitting ultraviolet ray is mounted on the first electrode 20, and first and second phosphors 91 and 92 which are excited by the ultraviolet ray to emit blue and green lights having peak wavelengths longer than the wavelength of the excitation light are arranged over the first light emitting diode 50.

A second light emitting diode 60 is mounted on the second electrode 30, and emits red light different in wavelength from lights emitted from the first and second phosphors 91 and 92.

A molding portion 80 for encapsulating the first and second light emitting diodes 50 and 60 is provided on the substrate 10, and the first phosphor 91 for emitting blue light, the second phosphor 92 for emitting green light and a scattering material 70 is contained within the molding portion 80.

This is mostly identical with the constitutional features of the first embodiment, and therefore, the overlapping specific descriptions will be omitted.

The first and second electrodes 20 and 30 are formed on the substrate 10, and the first and second light emitting diodes 50 and 60 are mounted on the first and second electrodes 20 and 30, respectively. Unlike the first embodiment, the first and second light emitting diodes 50 and 60 may be independently connected to third and fourth electrodes (not shown) through wires 100, respectively.

The molding portion 80 for encapsulating the first and second light emitting diodes 50 and 60 is formed on the substrate 10. The first and second phosphors 91 and 92 and the scattering material 70 which are uniformly distributed are included in the molding portion 80.

The first and second phosphor 91 and 92 are the first phosphor 91 for emitting blue light and the second phosphor for emitting green light, both of which are excited by the ultraviolet ray used as the excitation source as described above, and at least any one of silicate based phosphor, germanate based phosphor and germanate-silicate based phosphor may be used as the first and second phosphors 91 and 92.

The scattering material 70 is added to further facilitate the color mixing of the lights, and particles whose dimension ranges from 0.1 to 20 μm are used as the scattering material 70. At least any one of $SiO_2$, $Al_2O_3$, $TiO_2$, $Y_2O_3$, $CaCO_3$ and MgO may be used as the scattering material 70.

The light emitting device which includes the scattering material 70 may scatter light emitted from the light emitting diodes 50 and 60 by the scattering material and the other lights from the phosphors 91 and 92, so that an unnecessary light emission pattern may not be formed and the light may be uniformly emitted in a larger area. Accordingly, the lights having wavelengths different from each other are emitted in a larger area to be uniformly mixed with each other, so that the light emitting device can implement the uniform white light.

Figure 3:
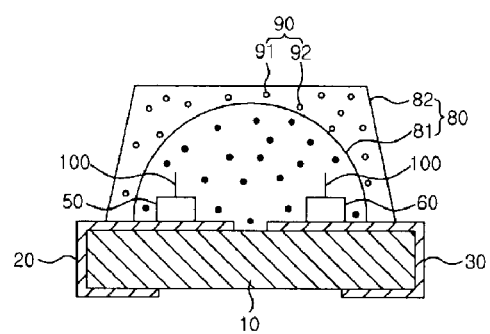
FIG. 3 is a sectional view showing a third embodiment of the light emitting device according to the present invention.

FIG. 3 is a sectional view showing a third embodiment of the light emitting device according to the present invention.

Referring to this figure, the light emitting device comprises a substrate 10 and first and second electrodes 20 and 30 formed on the substrate 10.

A light emitting diode 50 for emitting ultraviolet ray is mounted on the first electrode 20, and first and second phosphors 91 and 92 which are excited by the ultraviolet ray to emit blue and green lights having peak wavelengths longer than the wavelength of the excitation light are arranged over the first light emitting diode 50.

A second light emitting diode 60 is mounted on the second electrode 30, and emits red light different in wavelength from lights emitted from the first and second phosphors 91 and 92. This is mostly identical with the constitutional features of the first embodiment, and therefore, the overlapping specific descriptions will be omitted.

The light emitting device according to the this embodiment includes a first molding portion 81 for encapsulating the first and second light emitting diodes 50 and 60 on the substrate 10, and a second molding portion 82 for covering the first molding portion 81, wherein the first molding portion 81 may be formed of silicon resin having a hardness lower than that of the second molding portion 82. Accordingly, thermal stress applied to the first and second light emitting diodes 50 and 60 and the wires 100 can be reduced. In order to prevent the first molding portion 81 from being deformed by external force or the like, the second molding portion 82 may be formed of epoxy resin having relatively high hardness.

In this embodiment, the second phosphor 92 for emitting green light is contained in the first molding portion 81 while the first phosphor 91 for emitting blue light is contained in the second molding portion 82, so that light loss generated due to the re-absorption of the blue light, emitted from the first phosphor 91, into the second phosphor can be prevented.

FIG. 4 is a sectional view showing a fourth embodiment of the light emitting device according to the present invention.

Referring to the figure, the light emitting device comprises a substrate 10 and first and second electrodes 20 and 30 formed on the substrate 10. A light emitting diode 50 for emitting ultraviolet ray is mounted on the first electrode 20, and first and second phosphors 91 and 92 which are excited by the ultraviolet ray to emit blue and green lights having peak wavelengths longer than the wavelength of the excitation light are arranged over the first light emitting diode 50.

A second light emitting diode 60 is mounted on the second electrode 30, and emits red light different in wavelength from lights emitted from the first and second phosphors 91 and 92. This is mostly identical with the constitutional features of the third embodiment, and therefore, the overlapping specific descriptions will be omitted.

The light emitting device according to this embodiment comprises a first molding portion 81, which includes the first and second phosphors 91 and 92 and covers the first light emitting diode 50 for emitting ultraviolet ray, and a second molding portion 82 for encapsulating the first molding portion 81 and the second light emitting diode 60.

Accordingly, it is possible to prevent light loss in which the red light emitted from the second light emitting diode 60 is not emitted to the outside of the first and second molding portions 81 and 82 but disappears due to the first and second phosphor 91 and 92.

FIG. 5 is a sectional view showing a fifth embodiment of the light emitting device according to the present invention.

Referring to this figure, the light emitting device comprises a substrate 10 and first, second and third electrodes 30, 20 and 40 formed on the substrate 10. A light emitting diode 50 for emitting ultraviolet ray is mounted on the first electrode 20, and first and second phosphors 91 and 92 excited by the ultraviolet ray to emit blue and green lights having peak wavelengths longer than the wavelength of the excitation light are arranged over the first light emitting diode 50. This is mostly identical with the constitutional features of the fourth embodiment, and therefore, the overlapping specific descriptions will be omitted.

Second light emitting diodes 61 and 62 for emitting blue and red lights are mounted on the second and third electrodes 20 and 40, respectively, wherein the wavelengths of the blue and red lights are different from that of the light emitted from the phosphor 90. As such, unlike the embodiment in which the phosphor is used as the blue light source, the light emitting diode whose full width at half maximum (FWHM) is narrow is used to implement a light emitting device with an excellent color reproduction which is significantly required to be used as a back light source for a liquid crystal display (LCD).

Of course, the present invention is not limited thereto, but the molding portion 80 which includes the phosphor 90 for emitting green light according to this embodiment is formed to cover the second light emitting diode 61 for emitting blue light as well as the first light emitting diode 50 for emitting ultraviolet ray. Accordingly, since the phosphor 90 can emit light by the blue light as well as the ultraviolet ray, the excitation power can be enhanced, thereby increasing green light emitted from the phosphor.

As such, the present invention can be adapted to products with various configurations, and the technical features of the present invention are not limited to the aforementioned embodiments but can be variously modified and adjusted.

For example, in case of a lamp-type light emitting device with lead terminals, after ultraviolet and red light emitting diodes are mounted on one lead terminal, a first molding portion which contains a phosphor to cover the ultraviolet light emitting diode is formed and a second molding portion for encompassing the ultraviolet and red light emitting diodes and one end of the lead terminal is formed, in the similar manner as described above, thereby manufacturing the light emitting device according to the present invention.

Further, although a single blue light emitting diode chip and a single red light emitting diode chip are used in the above embodiments, a plurality of chips may be used, if necessary.

The invention claimed is:

1. A light emitting device, comprising:
 a first light emitting diode for emitting light in an ultraviolet wavelength region;
 at least one phosphor arranged around the first light emitting diode, the at least one phosphor to be excited by the light emitted from the first light emitting diode, and the at least one phosphor to emit light having a peak wavelength longer than the wavelength of the light emitted from the first light emitting diode;
 at least one second light emitting diode for emitting light having a wavelength different from the peak wavelength of the light emitted from the phosphor;
 a first molding portion comprising a first resin, the first molding portion containing the at least one phosphor; and
 a second molding portion comprising a second resin, the second molding portion arranged on the first molding portion,
 wherein the hardness of the second resin exceeds the hardness of the first resin.

2. The light emitting device as claimed in claim 1, wherein the phosphor comprises at least any one of silicate based phosphor, germanate based phosphor, and germanate-silicate based phosphor, and the each of phosphors comprises copper.

3. The light emitting device as claimed in claim 2, wherein at least any one of silicate based phosphor, germanate based phosphor, and germanate-silicate based phosphor further comprise lead.

4. The light emitting device as claimed in claim 1, wherein the phosphor comprises at least any one of a first phosphor having its peak wavelength positioned in a range of 410 nm to 500 nm and a second phosphor having its peak wavelength positioned in a range of 500 nm to 590 nm.

5. The light emitting device as claimed in claim 1, wherein the phosphor comprises a silicate based phosphor represented by Chemical Formula 1:

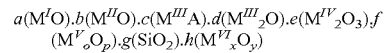

where $M^I$ is at least one element selected from the group containing Cu and Pb; $M^{II}$ is at least one element selected from the group consisting of Be, Mg, Ca, Sr, Ba, Zn, Cd and Mn; $M^{III}$ is at least one element selected from the group consisting of Li, Na, K, Rb, Cs, Au and Ag; $M^{IV}$ is at least one element selected from the group consisting of B, Al, Ga and In; $M^V$ is at least one element selected from the group consisting of Ge, V, Nb, Ta, W, Mo, Ti, Zr and Hf; $M^{VI}$ is at least one element selected from the group consisting of Bi, Sn, Sb, Sc, Y, La, Ce, Pr, Nd, Pm, Sm, Eu, Gd, Tb, Dy, Ho, Er, Tm, Yb and Lu; A is at least one element selected from the group consisting of F, Cl, Br and I; a, b, c, d, e, f, g, h, o, p, x and y are set in ranges of $0<a\leq2$, $0<b\leq8$, $0\leq c\leq4$, $0\leq d\leq2$, $0\leq e\leq2$, $0\leq f\leq2$, $0<g\leq10$, $0<h\leq5$, $1\leq o\leq2$, $1\leq p\leq5$, $1\leq x\leq2$, and $1\leq y\leq5$.

6. The light emitting device as claimed in claim 1, wherein the phosphor comprises a germanate and/or germanate-silicate based phosphor represented by Chemical Formula 2:

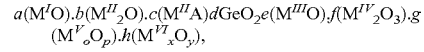

where $M^I$ is at least one element selected from the group containing Cu and Pb; $M^{II}$ is at least one element selected from the group consisting of Li, Na, K, Rb, Cs, Au and Ag; $M^{III}$ is at least one element selected from the group consisting of Be, Mg, Ca, Sr, Ba, Zn, Cd and Mn; $M^{IV}$ is at least one element selected from the group consisting of Sc, Y, B, Al, Ga, In and La; $M^V$ is one or more elements selected from the group consisting of Si, Ti, Zr, Mn, V, Nd, Ta, W and Mo; $M^{VI}$ is at least one element selected from the group consisting of Bi, Sn, Pr, Sm, Eu, Gd, Dy and Tb; A is at least one element selected from the group consisting of F, Cl, Br and I; a, b, c, d, e, f, g, h, o, p, x and y are set in ranges of $0<a\leq2$, $0\leq b\leq2$, $0\leq c\leq10$, $0<d\leq10$, $0\leq e\leq14$, $0\leq f\leq14$, $0\leq g\leq10$, $0\leq h\leq2$, $1\leq o\leq2$, $1\leq p\leq5$, $1\leq x\leq2$, and $1\leq y\leq5$.

7. The light emitting device as claimed in claim 1, wherein the at least one second light emitting diode comprises a first second light emitting diode for emitting light having a wavelength longer than the peak wavelength of the light emitted from the phosphor.

8. The light emitting device as claimed in claim 7, wherein the wavelength longer than the peak wavelength of the light emitted from the phosphor is in a wavelength range of 590 nm to 720 nm.

9. The light emitting device as claimed in claim 7, further comprising a second second light emitting diode for emitting light in a wavelength range of 420 nm to 480 nm, the wavelength being shorter than the peak wavelength of the light emitted from the phosphor.

10. The light emitting device as claimed in claim 1, further comprising:
 a substrate; and
 a first electrode and a second electrode arranged on the substrate, the first light emitting diode and the at least one second light emitting diode being respectively disposed on the first electrode and the second electrode.

11. The light emitting device as claimed in claim 10, wherein the first molding portion encapsulates the first light emitting diode and the at least one second light emitting diode.

12. The light emitting device as claimed in claim 11, wherein the first molding portion further comprises a scattering material.

13. The light emitting device as claimed in claim 10, wherein the first molding portion encapsulates the first light emitting diode, and the second molding portion encapsulates the at least one second light emitting diode.

14. The light emitting device as claimed in claim 13, wherein the at least one second light emitting diode is configured to emit light having a wavelength longer or shorter than the peak wavelength of the light emitted from the phosphor.

15. The light emitting device as claimed in claim 1, wherein the first molding portion encapsulates the first light emitting diode.

16. The light emitting device as claimed in claim 1, wherein the second molding portion encapsulates the at least one second light emitting diode.

* * * * *